United States Patent
Nittala et al.

(10) Patent No.: US 11,694,902 B2
(45) Date of Patent: Jul. 4, 2023

(54) METHODS, SYSTEMS, AND APPARATUS FOR PROCESSING SUBSTRATES USING ONE OR MORE AMORPHOUS CARBON HARDMASK LAYERS

(71) Applicant: Applied Materials, Inc., Santa Clara, CA (US)

(72) Inventors: Krishna Nittala, San Jose, CA (US); Sarah Michelle Bobek, Sunnyvale, CA (US); Kwangduk Douglas Lee, Redwood City, CA (US); Ratsamee Limdulpaiboon, San Jose, CA (US); Dimitri Kioussis, Sunnyvale, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 13 days.

(21) Appl. No.: 17/179,103

(22) Filed: Feb. 18, 2021

(65) Prior Publication Data
US 2022/0262643 A1    Aug. 18, 2022

(51) Int. Cl.
*H01L 21/308*    (2006.01)
*H01L 21/324*    (2006.01)
(Continued)

(52) U.S. Cl.
CPC ...... *H01L 21/3081* (2013.01); *H01L 21/3065* (2013.01); *H01L 21/324* (2013.01);
(Continued)

(58) Field of Classification Search
None
See application file for complete search history.

(56) References Cited

U.S. PATENT DOCUMENTS

| 6,900,002 | B1 * | 5/2005 | Plat ........................ G03F 7/091 430/311 |
| 7,981,810 | B1 | 7/2011 | Subramonium et al. |

(Continued)

FOREIGN PATENT DOCUMENTS

KR    20090016857 A    2/2009

OTHER PUBLICATIONS

PCT International Search Report and Written Opinion dated Jun. 7, 2022, for International Application No. PCT/US2022/016255.

*Primary Examiner* — Roberts P Culbert
(74) *Attorney, Agent, or Firm* — Patterson + Sheridan, LLP

(57) ABSTRACT

Aspects generally relate to methods, systems, and apparatus for processing substrates using one or more amorphous carbon hardmask layers. In one aspect, film stress is altered while facilitating enhanced etch selectivity. In one implementation, a method of processing a substrate includes depositing one or more amorphous carbon hardmask layers onto the substrate, and conducting a rapid thermal anneal operation on the substrate after depositing the one or more amorphous carbon hardmask layers. The rapid thermal anneal operation lasts for an anneal time that is 60 seconds or less. The rapid thermal anneal operation includes heating the substrate to an anneal temperature that is within a range of 600 degrees Celsius to 1,000 degrees Celsius. The method includes etching the substrate after conducting the rapid thermal anneal operation.

18 Claims, 5 Drawing Sheets

(51) Int. Cl.
*H01L 21/67* (2006.01)
*H01L 21/3065* (2006.01)

(52) U.S. Cl.
CPC .. *H01L 21/67069* (2013.01); *H01L 21/67115* (2013.01); *H01L 21/67207* (2013.01)

(56) References Cited

U.S. PATENT DOCUMENTS

| | | |
|---|---|---|
| 9,412,613 B2 | 8/2016 | Manna et al. |
| 9,589,799 B2 | 3/2017 | Reddy et al. |
| 2003/0003771 A1 | 1/2003 | Yang et al. |
| 2008/0081465 A1 | 4/2008 | Kim et al. |
| 2010/0304014 A1 | 12/2010 | Ishikawa |
| 2015/0348794 A1* | 12/2015 | Kim .................. H01L 21/32139 106/287.23 |
| 2017/0200614 A1* | 7/2017 | Mahajan ........... H01L 21/30604 |
| 2018/0286707 A1 | 10/2018 | Hudson et al. |

\* cited by examiner

METHODS, SYSTEMS, AND APPARATUS FOR PROCESSING SUBSTRATES USING ONE OR MORE AMORPHOUS CARBON HARDMASK LAYERS

BACKGROUND

Field

Aspects generally relate to methods, systems, and apparatus for processing substrates using one or more amorphous carbon hardmask layers. In one aspect, film stress is altered while facilitating enhanced etch selectivity.

Description of the Related Art

Hardmask layers of substrates can have high compressive stress, which can be unsuitable for operations. As an example, high compressive stress can cause delamination and can hinder device performance. Efforts to reduce compressive stress can involve longer operational times, larger expenditure of resources, reduced throughput, and loss of the hardmask layers. Efforts to reduce compressive stress can otherwise involve loss of etch selectivity.

Therefore, there is a need for improved methods, systems, and apparatus that facilitate enhanced etch selectivity and altering film stress to facilitate reduced operational times, reduced expenditure of resources, increased throughput, and reduced loss of hardmask layers.

SUMMARY

Aspects generally relate to methods, systems, and apparatus for processing substrates using one or more amorphous carbon hardmask layers. In one aspect, film stress is altered while facilitating enhanced etch selectivity.

In one implementation, a method of processing a substrate includes depositing one or more amorphous carbon hardmask layers onto the substrate, and conducting a rapid thermal anneal operation on the substrate after depositing the one or more amorphous carbon hardmask layers. The rapid thermal anneal operation lasts for an anneal time that is 60 seconds or less. The rapid thermal anneal operation includes heating the substrate to an anneal temperature that is within a range of 600 degrees Celsius to 1,000 degrees Celsius. The method includes etching the substrate after conducting the rapid thermal anneal operation.

In one implementation, a non-transitory computer readable medium for processing a substrate includes instructions that, when executed, cause a plurality of operations to be conducted. The plurality of operations include depositing one or more amorphous carbon hardmask layers onto the substrate, and conducting a rapid thermal anneal operation on the substrate after depositing the one or more amorphous carbon hardmask layers. The rapid thermal anneal operation lasts for an anneal time that is 60 seconds or less. The rapid thermal anneal operation includes heating the substrate to an anneal temperature that is within a range of 600 degrees Celsius to 1,000 degrees Celsius. The plurality of operations include etching the substrate after conducting the rapid thermal anneal operation.

In one implementation, a system for processing a substrate includes a deposition chamber, an anneal chamber, a transfer chamber coupled to the deposition chamber and the anneal chamber, and a cryogenic etch chamber. The system includes a controller including instructions that, when executed, cause the deposition chamber to deposit one or more amorphous carbon hardmask layers onto the substrate. The instructions, when executed, cause the anneal chamber to conduct a rapid thermal anneal operation on the substrate after the depositing the one or more amorphous carbon hardmask layers onto the substrate. The rapid thermal anneal operation lasts for an anneal time that is 60 seconds or less. The rapid thermal anneal operation includes heating the substrate to an anneal temperature that is within a range of 600 degrees Celsius to 1,000 degrees Celsius. The instructions, when executed, cause the cryogenic etch chamber to etch the substrate after the rapid thermal anneal operation is conducted.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects generally relate to methods, systems, and apparatus for processing substrates using one or more amorphous carbon hardmask layers. In one aspect, film stress is altered while facilitating enhanced etch selectivity.

Figure 1:
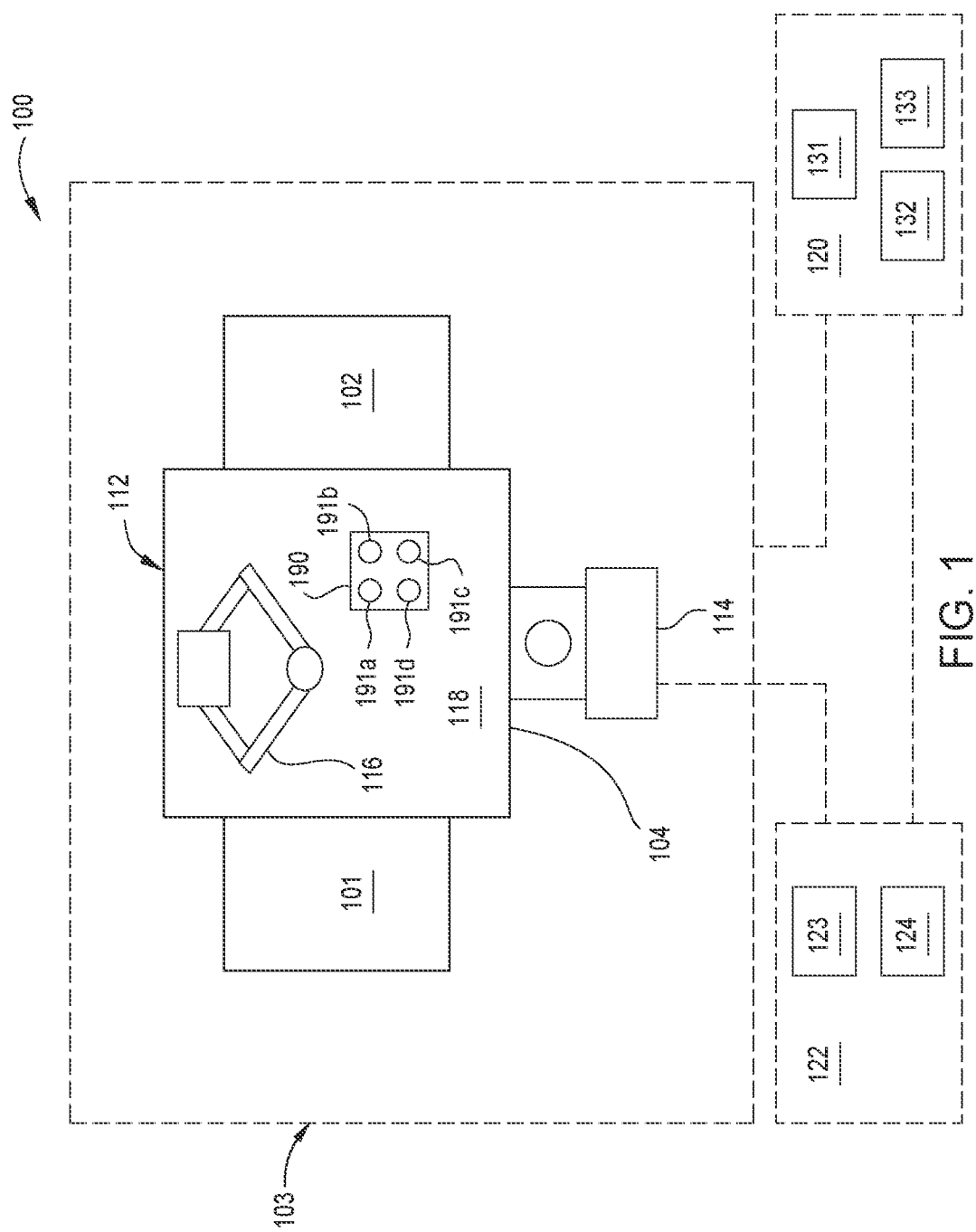
FIG. 1 is a schematic partial view of a system for processing substrates, according to one implementation.

FIG. 1 is a schematic partial view of a system 100 for processing substrates, according to one implementation. The system 100 includes a cluster tool 103 having a plurality of process chambers 101, 102. While process chambers 101, 102 are illustrated, it is contemplated that the system 100 may include more or less than five process chambers disposed about and coupled to the transfer chamber 112. The cluster tool 103 can be communicatively, electrically, mechanically, or otherwise coupled to one or more additional cluster tools and/or one or more other systems, shown collectively as a second cluster tool 122 in FIG. 1. Substrates are transferred between the cluster tool 103 and the second cluster tool 122 using a transfer system and can be exposed to ambient conditions. In one embodiment, which can be combined with other embodiments, substrates are transferred to or from the second cluster tool 122 from or into a factory interface 114 of the cluster tool 103. From the factory interface 114, substrates can be transferred to the transfer chamber 112. The transfer volume 118 of the transfer chamber 112 can be an environmentally-controlled environment, such as an environment where the temperature and/or pressure can be set and maintained and/or adjusted. In one embodiment, which can be combined with other embodiments, the transfer chamber 112 is held under vacuum pressure. A central transfer robot 116 is configured to transfer substrates among and between the process chambers 101, 102. It is contemplated that the system 100 may include duplicative chambers of the plurality of process chambers 101, 102.

The cluster tool 103 includes a deposition chamber 101 and an anneal chamber 102 coupled to the transfer chamber 112. The present disclosure contemplates that other process chambers, such as clean chambers configured to conduct a clean operation on the substrates, can be disposed about and coupled to the transfer chamber 112. The second cluster tool 122 includes a lithography chamber 123 and an etch chamber 124. The deposition chamber 101 is configured to deposit one or more amorphous carbon hardmask layers onto the substrates. The anneal chamber 102 is configured to conduct a rapid thermal anneal operation on the substrates. The etch chamber 124 is configured to conduct an etching operation on the substrates, such as a cryogenic etching operation. The lithography chamber 123 is configured to conduct a patterning operation on the substrates, such as a photolithography patterning operation. The deposition chamber 101, the anneal chamber 102, and the transfer chamber 112 are mounted to a frame 104 of the cluster tool 103.

A controller 120 is coupled to the cluster tool 103 and the second cluster tool 122 of the system 100 to control operations of the deposition chamber 101, the anneal chamber 102, the lithography chamber 123, and the etch chamber 124. The controller 120 includes a central processing unit (CPU) 131, a memory 132 containing instructions, and support circuits 133 for the CPU 131. The controller 120 controls the system 100 directly, or via other computers and/or controllers (not shown) coupled to the cluster tool 103 and the second cluster tool 122. The controller 120 is of any form of a general-purpose computer processor that is used in an industrial setting for controlling various chambers and equipment, and sub-processors thereon or therein.

The memory 132, or non-transitory computer readable medium, is one or more of a readily available memory such as random access memory (RAM), read only memory (ROM), floppy disk, hard disk, flash drive, or any other form of digital storage, local or remote. The support circuits 133 are coupled to the CPU 131 for supporting the CPU 131 (a processor). The support circuits 133 include cache, power supplies, clock circuits, input/output circuitry and subsystems, and the like. Substrate processing parameters and operations are stored in the memory 132 as a software routine that is executed or invoked to turn the controller 120 into a specific purpose controller to control the operations of the system 100. The controller 120 is configured to conduct any of the methods described herein. The instructions stored on the memory 132, when executed, cause one or more of operations 501-508 of method 500 to be conducted.

The system 100 includes one or more metrology sensors that monitor conditions and/or properties of one or more aspects of the system 100, such as the transfer volume 118 of the transfer chamber 112, a processing volume of the deposition chamber 101, a processing volume of the anneal chamber 102, a processing volume of the lithography chamber 123, and/or a processing volume of the etch chamber 124. The system 100 includes one or more modules 190 (one is shown) having one or more sensors 191a-191d (four are shown). The module 190 having the sensors 191a-191d is disposed in the transfer volume 118 of the transfer chamber 112. The present disclosure contemplates that one or more modules having one or more sensors can be disposed in one or more of the deposition chamber 101, the anneal chamber 102, the lithography chamber 123, and/or the etch chamber 124.

The module 190 having the sensors 191a-191d may be attached to the one or more of the chamber 101, 102, 112, 123, and 124, such as attached to an inner surface of the respective chamber 101, 102, 112, 123, or 124. At least one of the sensors 191a-191d is configured to detect, monitor, and/or measure contaminants, and concentrations thereof, in the transfer volume 118, such as while the central transfer robot 116 transfers substrates. In one example, the one or more sensors 191a-191d include one or more in-situ metrology sensors.

At least one of the sensors 191a-191d is configured to detect, monitor, and/or measure conditions and/or properties of the substrates processed in the system 100, such as while the substrates are being transferred by the central transfer robot 116 or while the substrates are being processed in the process chambers 101, 102, 123, 124. In one example, the one or more sensors 191a-191d include one or more on-wafer spectroscopy sensors, and/or one or more contaminant sensors. In one example, the one or more sensors 191a-191d include one or more oxygen sensors, one or more water vapor sensors, one or more X-ray fluorescence spectroscopy (XRF) sensors, and/or one or more X-ray photoelectron spectroscopy (XPS) sensors. In one embodiment, which can be combined with other embodiments, the sensors 191a-191d are configured to measure: one or more thicknesses of one or more amorphous carbon hardmask layers of the substrates (such as before and/or after a rapid thermal anneal operation), a bow of the substrates, and/or a film stress of the one or more amorphous carbon hardmask layers of the substrates.

The plurality of instructions executed by the controller 120 include instructions that instruct the one or more sensors 191a-191d to detect, monitor, and/or measure contaminants, conditions, and/or properties. The instructions in the memory 132 of the controller 120 can include one or more machine learning/artificial intelligence algorithms that can be executed in addition to the operations described herein. As an example, a machine learning/artificial intelligence algorithm executed by the controller 120 can optimize and alter operational parameters based on one or more sensor measurements taken by the one or more sensors 191a-191d. The operational parameters can include for example the anneal time, the anneal temperature, the anneal pressure, the anneal gas composition, the anneal flow rate, the deposition temperature, the deposition pressure, the first flow rate, the second flow rate, the total flow rate, the reactive precursor gases composition, the inert gases composition, the etch temperature, the hardmask thickness, the film stress, the bow of the substrate, the hydrogen content, the etch selectivity, the Young's Modulus, and/or the film density—each described below.

The one or more machine learning/artificial intelligence algorithms can account for a bow of the substrate, a measured film thickness after the rapid thermal anneal operation, and/or a measured film stress after the rapid thermal anneal operation to optimize the operational parameters such as the anneal temperature. In one embodiment, which can be combined with other embodiments, the one or more machine learning/artificial intelligence algorithms can measure film thickness (such as hardmask thickness) and film stress after the rapid thermal anneal operation to determine if the deposition operation and/or the rapid thermal anneal operation is to be repeated one or more additional times. In one embodiment, which can be combined with other embodiments, the one or more machine learning/artificial intelligence algorithms can determine an optimized anneal time at which it takes for the one or more amorphous carbon hardmask layers to achieve a neutral film stress, such as a tensile film stress or a film stress that is 100 MPa or less. In one example, which can be combined with other examples, a bow of an incoming substrate is measured and the one or more machine learning/artificial intelligence algorithms determine the optimized anneal time. In one embodiment, which can be combined with other embodiments, the one or more machine learning/artificial intelligence algorithms executed by the controller 120 determine an optimized anneal time, an optimized anneal temperature, an optimized anneal pressure, an optimized anneal gas composition, an optimized anneal flow rate, and/or a number of repetitive iterations for the rapid thermal anneal operation.

Figure 2:
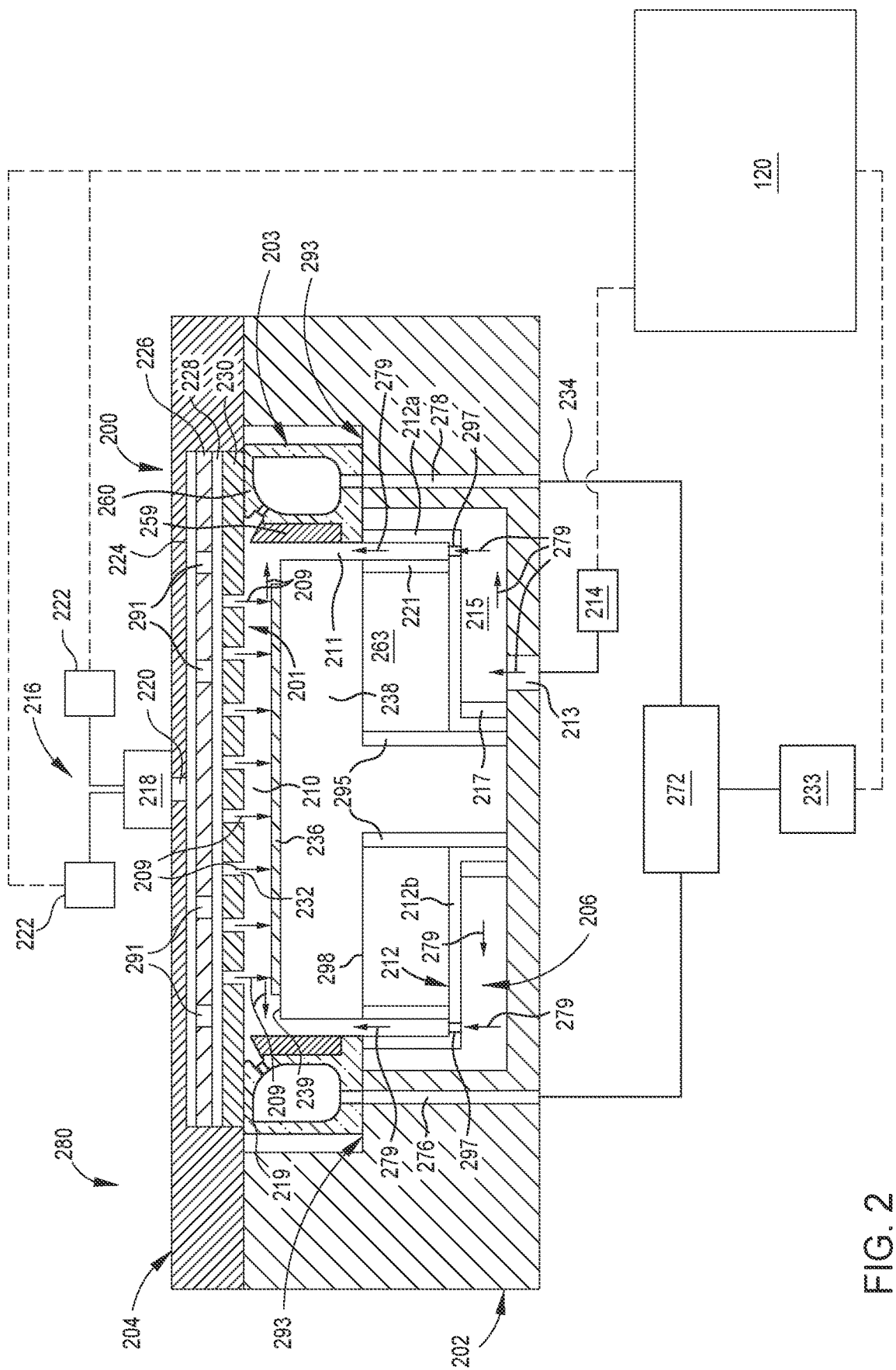
FIG. 2 is a schematic cross-sectional view of a substrate processing chamber, according to one implementation.

FIG. 2 is a schematic cross-sectional view of a substrate processing chamber 200, according to one implementation. The substrate processing chamber 200 may be, for example, a chemical vapor deposition (CVD) chamber or a plasma enhanced CVD (PECVD) chamber. The present disclosure contemplates that other chambers may be used, such as an atomic layer deposition (ALD) chamber or a physical vapor deposition (PVD) chamber. The substrate processing chamber 200 is a deposition chamber that may be used as the deposition chamber 101 of the system 100 shown in FIG. 1.

The substrate processing chamber 200 has a chamber body 202 and a chamber lid 204 disposed on the chamber body 202. The chamber body 202 includes an internal volume 206 therein. The present disclosure contemplates that the chamber body 202 may be made of a single body, or two or more bodies. The chamber body 202 includes one or more sidewalls and a base. The substrate processing chamber 200 includes a gas distribution assembly 216 coupled to or disposed in the chamber lid 204 to deliver a flow of one or more processing gases 209 into a processing region 210 through a showerhead 201. The one or more processing gases may include one or more of argon and/or $C_3H_6$, among other gases. In one example, the one or more processing gases include one or more reactive precursor gases and one or more inert gases (to generate a plasma). The showerhead 201 includes a backing plate 226 and a faceplate 230. The gas distribution assembly 216 includes a gas manifold 218 coupled to a gas inlet passage 220 formed in the chamber lid 204. The gas manifold 218 receives a flow of one or more processing gases from one or more gas sources 222 (two are shown). The flow of processing gases received from the one or more gas sources 222 distributes across a gas box 224, flows through a plurality of openings 291 of the backing plate 226, and further distributes across a plenum 228 defined by the backing plate 226 and the faceplate 230. The flow of processing gases 209 then flows into a processing region 210 of the internal volume 206 through one or more gas openings 232 formed in a lower surface 219 of the faceplate 230 of the showerhead 201.

The internal volume 206 includes a pedestal 238 disposed in the chamber body 202. The pedestal 238 supports a substrate 236 within the substrate processing chamber 200. The pedestal 238 supports the substrate 236 on a support surface 239 of the pedestal 238. The pedestal 238 includes a heater and an electrode disposed therein. The electrode may receive direct current (DC) voltage, radio frequency (RF) energy, or alternating current (AC) energy to facilitate processing. The pedestal 238 is movably disposed in the internal volume 206 by a lift system 295. Movement of the pedestal 238 facilitates transfer of the substrate 236 to and from the internal volume 206 through a slit valve formed through the chamber body 202. The pedestal 238 may also be moved to different processing positions for processing of the substrate 236.

During substrate processing, as processing gases (such as the processing gases 209) flow into the processing region 210, a heater heats the pedestal 238 and the support surface 239. Also during substrate processing, the electrode in the pedestal 238 propagates radio frequency (RF) energy, alternating current (AC), or direct current (DC) voltage to facilitate plasma generation in the processing region 210 and/or to facilitate chucking of the substrate 236 to the pedestal 238. The present disclosure also contemplates that a power source may be coupled to the showerhead 201 to supply RF energy, AC, or DC voltage to facilitate generating the plasma. The heat, gases, and energy from the electrode in the pedestal 238 facilitate deposition of a film in the form of one or more amorphous carbon hardmask layers onto the substrate 236 during substrate processing. The faceplate 230, which is grounded via coupling to the chamber body 202, and the electrode of the pedestal 238, facilitate formation of a capacitive plasma coupling. When power is supplied to the electrode in the pedestal 238, an electric field is generated between the faceplate 230 and pedestal 238 such that atoms of gases present in the processing region 210 between the pedestal 238 and the faceplate 230 are ionized and release electrons. The ionized atoms accelerate to the pedestal 238 to facilitate formation of the one or more amorphous carbon hardmask layers on the substrate 236.

A pumping device 203 is disposed in the substrate processing chamber 200. The pumping device 203 facilitates removal of gases from the internal volume 206 and processing region 210. The gases exhausted by the pumping device 203 include one or more of a processing gas and a processing residue. The processing residue may result from the process of depositing a film onto the substrate 236. The pumping device 203 includes a pumping liner 260 disposed on a stepped surface 293 of the chamber body 202 and an isolator ring 259 disposed between the pedestal 238 and the pumping liner 260.

The substrate processing chamber 200 includes a purge gas inlet 213 disposed at a bottom of the chamber body 202. The purge gas inlet 213 is an opening formed in a bottom surface of the chamber body 202. The purge gas inlet 213 is fluidly connected to a purge gas source 214 that supplies one or more purge gases 279 to the purge gas inlet 213. The one or more purge gases 279 include one or more inert gases, such as one or more of Ar and/or $N_2$. The one or more purge gases 279 flow along a purge gas flow path 211. A bowl 212 is disposed in the internal volume 206. The bowl 212 defines a purge gas volume 215. One or more bellows 217 may be disposed in the purge gas volume 215. One or more bellows 221 are disposed above a horizontal portion 212b of the bowl 212 and below a bottom surface 298 of the pedestal 238. The one or more bellows 221 separate a dead volume 263 from a portion of the purge gas flow path 211 that is between the one or more bellows 221 and a vertical portion 212a of the bowl 212. During substrate processing operations, and while processing gases 209 flow into the processing region 210 from the showerhead 201, the purge gas inlet 213 flows the one or more purge gases 279 into the purge gas volume 215. The horizontal portion 212b of the bowl 212 includes one or more purge gas openings 297 that flow the purge gases 279 from the purge gas volume 215 and into the purge gas flow path 211. The processing gases 209 and the purge gases 279 meet and/or mix at or near the support surface 239. The processing gases 209 and the purge gases 279 mix to form a gas mixture that is exhausted by the pumping device 203. The pumping device 203 includes the pumping liner 260 and the isolator ring 259. The gas mixture is exhausted through a first conduit 276 and a second conduit 278, through a foreline 272, and to a vacuum pump 233. The vacuum pump 233 controls the pressure within the processing region 210 and exhausts gases and residue from the processing region 110.

Figure 3:
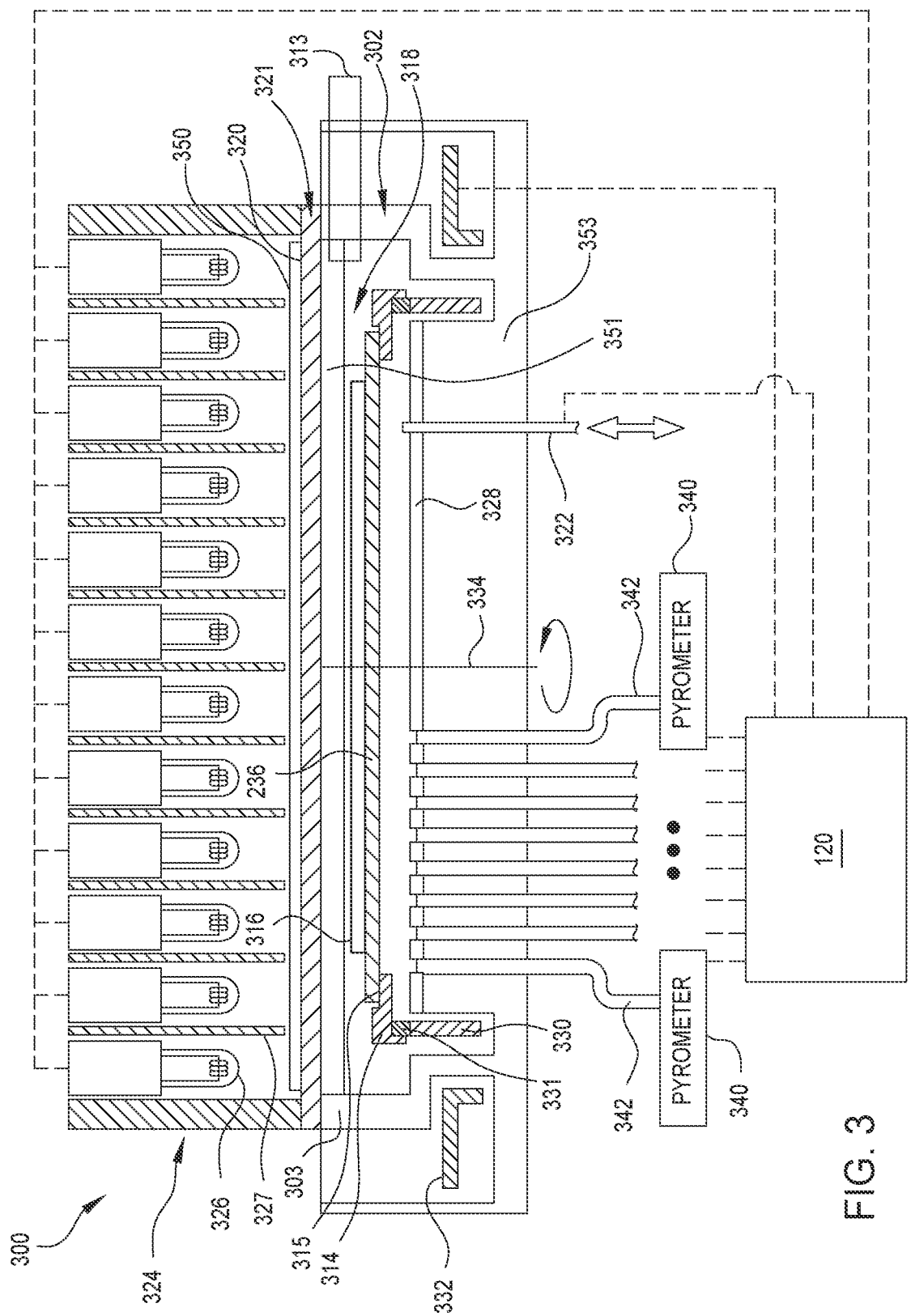
FIG. 3 is a partial schematic cross-sectional view of an anneal chamber, according to one implementation.

FIG. 3 is a partial schematic cross-sectional view of an anneal chamber 300, according to one implementation. The anneal chamber 300 is a rapid thermal anneal chamber. The anneal chamber 300 can be used as the anneal chamber 102 of the system 100 in FIG. 1. A substrate 236 to be processed in the anneal chamber 300 is provided through a valve (such as a slit valve) or access port 313 into the processing volume 318 of the anneal chamber 300. The substrate 236 is supported on a periphery thereof by an annular edge ring 314. The edge ring 314 has an annular sloping shelf 315 contacting the corner of the substrate 236. The substrate 236 is oriented such that processed features 316 already formed on a top surface of the substrate 236 face upwardly toward a radiant heating apparatus 324. The substrate 236 is the substrate that was processed in the deposition chamber 200 described above. The processed features 316 include the one more amorphous carbon hardmask layers.

The anneal chamber 300 includes a chamber body 302 and a processing volume 318 disposed within the chamber body 302. The chamber body 302 includes one or more sidewalls 303. The processing volume 318 is defined on an upper side thereof by a transparent quartz window 320. The anneal chamber 300 conducts a rapid thermal anneal operation on the substrate 236. In one embodiment, which can be combined with other embodiments, the rapid thermal anneal operation is capable of uniformly heating the substrate 236 at rates of about 10 degrees Celsius per second and higher, for example at rates of about 10 degrees per second to about 250 degrees per second or higher. Ramp-down (cooling) rates for the rapid thermal anneal operation are in a range of about 80 degrees Celsius per second to about 150 degrees Celsius per second. Aspects of the present disclosure may also be applied to flash annealing, such as annealing a substrate in under 5 seconds, such as less than 1 second, or in a plurality of milliseconds.

Three lift pins 322 are raised and lowered to engage and support a bottom surface (such as a backside surface) of the substrate 236 when the substrate 236 is handled by a substrate transfer apparatus, such as a robot. A robot blade of the robot and/or a robot arm of the robot extends through the valve or access port 313 to provide the substrate 236 into the anneal chamber 300 and onto the lift pins 322. The substrate 236 is then lowered onto the edge ring 314. In order to heat the substrate 236 in the processing volume 318, the radiant heating apparatus 324 is positioned above the window 320 to direct radiant energy toward the substrate 236. In the anneal chamber 300, the radiant heating apparatus includes a plurality of heat lamps 326 positioned in respective reflective tubes 327 arranged in a hexagonal close-packed array above the window 320. The plurality of heat lamps 326 include high-intensity tungsten-halogen lamps. The plurality of heat lamps 326 are positioned above the edge ring 314.

The heat lamps 326 involve resistive heating to quickly elevate, or ramp up, the temperature of the radiant source to ramp the temperatures of the processing volume 318 and the substrate 236. Heat lamps 326 may include incandescent and tungsten halogen incandescent lamps having an envelope of glass or silica surrounding a filament and flash lamps which include an envelope of glass or silica surrounding a gas, such as xenon. Heat lamps 326 may include arc lamps that include an envelope of glass, ceramic, or silica that surrounds a gas or vapor. Such lamps provide radiant heat when the gas is energized. As provided herein, the term lamp is intended to include lamps having an envelope that surrounds a heat source. The "heat source" of a lamp refers to a material or element that can increase the temperature of the substrate 236, for example, a filament or gas than may be energized. The present disclosure contemplates that one or more anneal lasers and/or one or more resistive heater elements embedded in a pedestal (on which the substrate 236 would be supported) can be used in place of or in addition to the plurality of heat lamps 326 to heat the substrate 236.

A reflector 328 extending parallel to and over an area greater than the substrate 236 and facing the bottom surface of the substrate 236 efficiently reflects heat radiation emitted from the substrate 236 back to the substrate 236. In one embodiment, which can be combined with other embodiments, a reflector plate is included to enhance the apparent emissivity of the substrate 236. The reflector 328, which may have a gold coating or multilayer dielectric interference mirror, effectively forms a black-body cavity at the back of the substrate 236 that functions to distribute heat from warmer portions of the substrate 236 to cooler portions. The chamber body 302 includes an upper wall 321 and a lower wall 353. The reflector 328 is disposed on a water-cooled base formed in the lower wall 353 made of a material, such as a metal, chosen for an ability to heat sink excess radiation from the substrate 236, such as during cool down. The upper wall 321 includes the quartz window 320 and a lower wall 353 is substantially parallel to the upper wall 321. The lower wall 353 may be made of a material that is significantly non-transparent, such as a metal.

The edge ring 314 is disposed on and supported on a support cylinder 331, and is movable relative to the support cylinder 331 and a rotor 330 upon thermal expansion and/or retraction of the edge ring 314. The edge ring 314 may also be moved using the support cylinder 331 and the rotor 330. The support cylinder 331 may include a thermal insulation material. The support cylinder 331 is supported on, and may be coupled to or formed as part of, the rotor 330. The rotor 330 and the support cylinder 331 are rotatable. The rotor 330 is cylindrical. The rotor 330 is magnetically levitated in the chamber body 302. The rotor 330 is magnetically coupled to a drive ring 332 positioned outside of the one or more sidewalls 303 of the chamber body 302. Gravitational forces and a lower shoulder extending downward from a lower surface of the edge ring 315 facilitate retaining the edge ring 314 on the support cylinder 331 and the rotor 330. In one embodiment, which can be combined with other embodiments, the drive ring 332 is a rotatable flange and is magnetically coupled to the rotor 330 such that the rotor 330 rotates with rotation of the drive ring 332. In such an embodiment, a motor rotates the drive ring 332 to rotate the rotor 330. In one embodiment, which can be combined with other embodiments, the drive ring 332 is fixed relative to the chamber body 302 and includes electrical coils that, when powered, generate magnetic forces to magnetically rotate and/or levitate the rotor 330. When the rotor 330 rotates, the edge ring 314 and the substrate 236 supported on the edge ring 314 rotate about a center axis 334 of the substrate 236.

The heat lamps 326 may be divided into heating zones arranged in a generally ring-like formation about the center axis 334. Control circuitry varies the voltage delivered to the heat lamps 326 in the different zones to thereby tailor the radial distribution of radiant energy. One or more pyrometers 340 are coupled through one or more optical light pipes 342 positioned to face the bottom surface of the substrate 236 through apertures in the reflector 328. The one or more pyrometers 340 measure the temperature across a radius of the stationary or rotating substrate 236. The light pipes 342 may be formed of various structures including sapphire, metal, and silica fiber. The pyrometers 340 are disposed below the edge ring 314, and the edge ring 314 is disposed between the pyrometers 340 and the plurality of heat lamps 326. In one embodiment, which can be combined with other embodiments, a film of reflective coating 350 may be disposed on the side of the window 320 facing the heat lamps 326. In one embodiment, which can be combined with other embodiments, a reflective coating 351 is disposed on the side of the window 320 facing the substrate 236. In the implementation shown in FIG. 1, a reflective coating 350 and 351 is disposed on both sides of the window 320. The reflective coating 350 and 351 facilitates blocking radiation in the pyrometer bandwidth from propagating through the reflective coating 350 and 351 to facilitate accurate measurements of the pyrometers 340.

Figure 4:
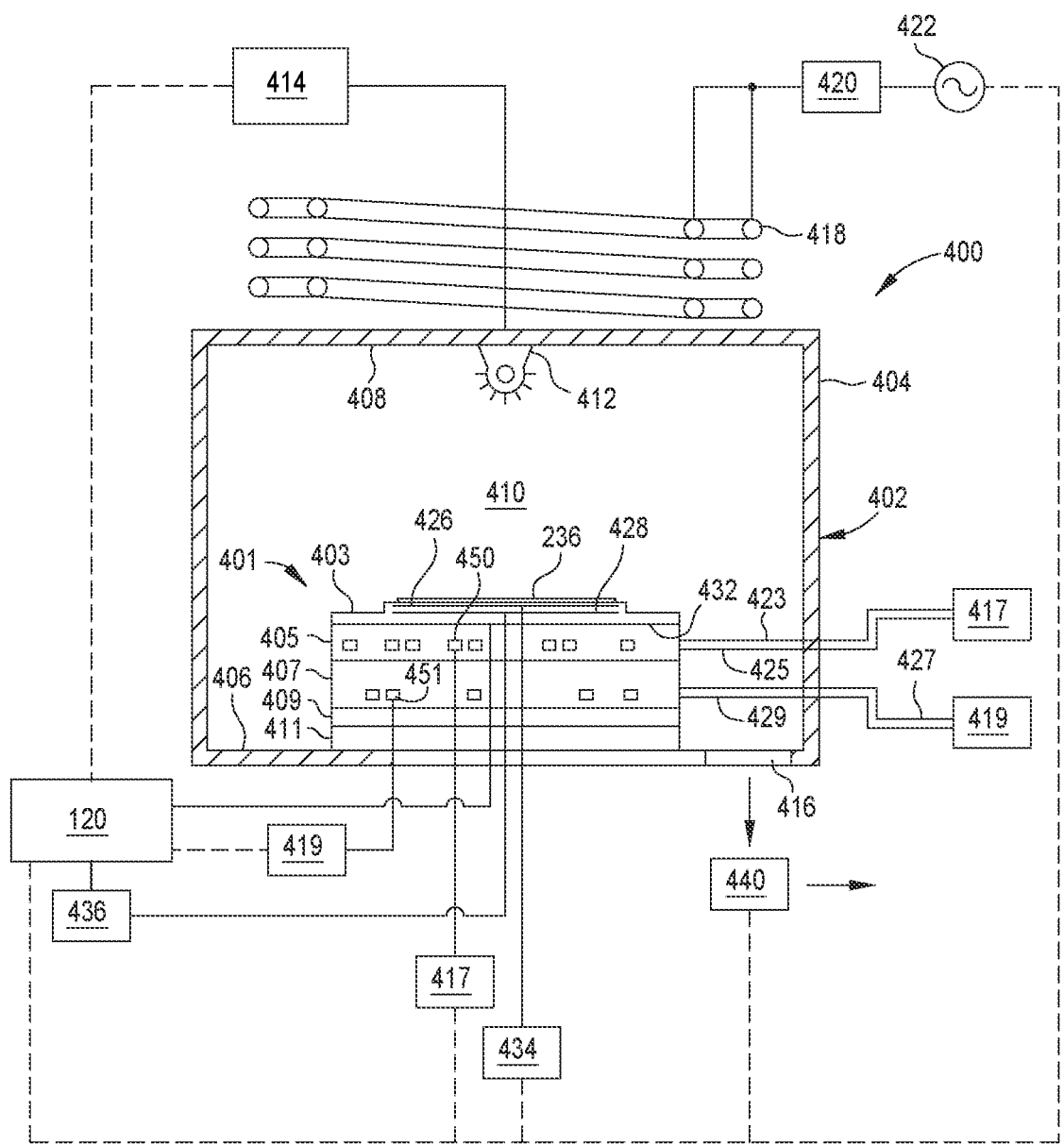
FIG. 4 is a cross-sectional partial schematic view of an etch chamber, according to one implementation.

FIG. 4 is a cross-sectional partial schematic view of an etch chamber 400, according to one implementation. The etch chamber 400 includes a substrate support assembly 401 that supports the substrate 236 that was annealed in the anneal chamber 300 as described above. The etch chamber 400 can be used as the etch chamber 124 of the system 100 in FIG. 1. The etch chamber 400 can be a plasma processing chamber. The etch chamber 400 is a cryogenic etch chamber configured to conduct a cryogenic etching operation. Dry reactive ion etching the substrate 236 maintained at a cryogenic etching temperature enables ions to bombard the upward facing surfaces of materials disposed on the substrate 236 with decreased spontaneous etching so that trenches with smooth, vertical sidewalls are formed. For example, diffusion of ions in porosities of a low-k dielectric material disposed on the substrate 236 uniformly maintained at the cryogenic etching temperature is decreased while ions continue to bombard the upward facing surface of the low-k dielectric material to form trenches with smooth, vertical sidewalls. Additionally, selectivity of etching one material versus another can be improved at the cryogenic processing temperature. For example, selectivity between silicon (Si) and silicon dioxide ($SiO_2$) increases exponentially as temperature is decreased.

The etch chamber 400 includes a chamber body 402 having sidewalls 404, a bottom 406 and a lid 408 that enclose a processing region 410. An injection apparatus 412 is coupled to the sidewalls 404 and/or lid 408 of the chamber body 402. A gas panel 414 is coupled to the injection apparatus 412 to allow process gases to be provided into the processing region 410. The injection apparatus 412 may be one or more nozzle or inlet ports, or alternatively a showerhead. Process gases, along with any processing by-products, are removed from the processing region 410 through an exhaust port 416 formed in the sidewalls 404 or a bottom 406 of the chamber body 402. The exhaust port 416 is coupled to a pumping system 440, which includes throttle valves and pumps utilized to control the vacuum levels within the processing region 410.

The process gases may be energized to form a plasma within the processing region 410. The process gases may be energized by capacitively or inductively coupling RF power to the process gases. In the embodiment shown, which can be combined with other embodiments, a plurality of coils 418 are disposed above the lid 408 of the etch chamber 400 and coupled through a matching circuit 420 to an RF power source 422. The substrate support assembly 401 is disposed in the processing region 410 below the injection apparatus 412. The substrate support assembly 401 includes an ESC 403 and an ESC base assembly 405. The ESC base assembly 405 is coupled to the ESC 403 and a facility plate 407. The facility plate 407 supported by a ground plate 411 is configured to facilitate electrical, cooling, heating, and gas connections with the substrate support assembly 401. The ground plate 411 is supported by the bottom 406 of the etch chamber 400. An insulator plate 409 insulates the facility plate 407 from the ground plate 411.

The ESC base assembly 405 includes a base channel 450 coupled to a cryogenic chiller 417. In one embodiment, which can be combined with other embodiments, the cryogenic chiller 417 is in fluid communication with the base channel 450 via a base inlet conduit 423 connected to an inlet of the base channel 450 and via a base outlet conduit 425 connected to an outlet of the base channel 450 such that the ESC base assembly 405 is maintained at a cryogenic etching temperature. In one embodiment, which can be combined with other embodiments described herein, the cryogenic chiller 417 is coupled to an interface box to control a flow rate of a base fluid. The base fluid may include a material that can maintain the cryogenic etching temperature, such as less than 0 degrees Celsius. The cryogenic chiller 417 provides the base fluid, which is circulated through the base channel 450 of the ESC base assembly 405. The base fluid flowing through the base channel 450 enables the ESC base assembly 405 to be maintained at the cryogenic etching temperature, which assists in controlling the lateral temperature profile of the ESC 403 so that the substrate 236 disposed on the ESC 403 is uniformly maintained at the cryogenic etching temperature. In one embodiment, which can be combined in other embodiments described herein, the cryogenic chiller 417 is a single-stage chiller operable to maintain the cryogenic temperature at the cryogenic etching temperature. In another embodiment, which can be combined in other embodiments described herein, the cryogenic chiller 417 is a two-stage chiller that utilizes refrigerant internal to the two-stage chiller such the base fluid is maintained at the cryogenic etching temperature.

The facility plate 407 includes a facility channel 451 coupled to a chiller 419. The chiller 419 is in fluid communication with the facility channel 451 via a facility inlet conduit 427 connected to an inlet of the facility channel 451 and via a facility outlet conduit 429 connected to an outlet of the facility channel 451 such that the facility plate 407 is maintained at a predetermined ambient temperature. In one embodiment, which can be combined with other embodiments, the cryogenic chiller 417 is coupled to an interface box to control a flow rate of the facility fluid. The facility fluid may include a material that can maintain an ambient temperature between about 0 degrees Celsius to about 60 degrees Celsius. The chiller 419 provides the facility fluid, which is circulated through the facility channel 451 of the facility plate 407. The facility fluid flowing through the facility channel 451 enables the facility plate 407 to be maintained at the predetermined ambient temperature, which assists in maintaining the insulator plate 409 at the ambient temperature.

The ESC 403 has a support surface 430 and a bottom surface 432 opposite the support surface 430. In one embodiment, which can be combined with other embodiments, the ESC 403 is fabricated from a ceramic material, such as alumina ($Al_2O_3$), aluminum nitride (AlN) or other suitable material. The ESC 403 may be fabricated from a polymer, such as polyimide, polyetheretherketone, polyaryletherketone and the like. The ESC 403 includes a chucking electrode 426 disposed therein. The chucking electrode 426 is coupled through an RF filter and the facility plate 407 to a chucking power source 434, which provides a DC power to electrostatically secure the substrate 236 to the support surface 430 of the ESC 403. The RF filter prevents RF power utilized to form a plasma (not shown) within the etch chamber 400 from damaging electrical equipment or presenting an electrical hazard outside the chamber.

The ESC 403 includes one or more resistive heaters 428 embedded therein. The resistive heaters 428 are utilized to elevate the temperature of the ESC 403 to the cryogenic processing temperature suitable for processing a substrate 236 disposed on the support surface 430. The resistive heaters 428 are coupled through the facility plate 407 and an RF filter to a heater power source 436. The RF filter prevents RF power utilized to form a plasma (not shown) within the etch chamber 400 from damaging electrical equipment or presenting an electrical hazard outside the chamber. The heater power source 436 may provide 500 watts or more power to the resistive heaters 428. The controller 120 is coupled to the heater power source 436 to control the operation of the heater power source 436, which is generally set to heat the substrate 236 to the cryogenic etching temperature. In one embodiment, which can be combined with other embodiments, the resistive heaters 428 include a plurality of laterally separated heating zones, wherein the controller 120 enables at least one zone of the resistive heaters 428 to be preferentially heated relative to the resistive heaters 428 located in one or more of the other zones. For example, the resistive heaters 428 may be arranged concentrically in a plurality of separated heating zones. The resistive heaters 428 maintain the substrate 236 at the cryogenic etching temperature suitable for processing.

The substrate support assembly 401 may include one or more probes disposed therein to determine the temperature of the ESC 403 and/or the ESC base assembly 405. In one embodiment, which can be combined with other embodiments described herein, one or more low temperature optical probe assemblies are coupled the controller 120. In one embodiment, which can be combined with other embodiments described herein, each of low temperature optical probe assemblies corresponds to a zone of the plurality of laterally separated heating zones of the resistive heaters 428, wherein the low temperature optical probes measure the temperature of each zone of the ESC 403. The controller 120 is coupled to the heater power source 436 so that each zone of the resistive heaters 428 is independently heated for the lateral temperature profile of the ESC 403 to be substantially uniform based on temperature measurements so that the substrate 236 disposed on the ESC 403 is uniformly maintained at the cryogenic etching temperature.

Figure 5:
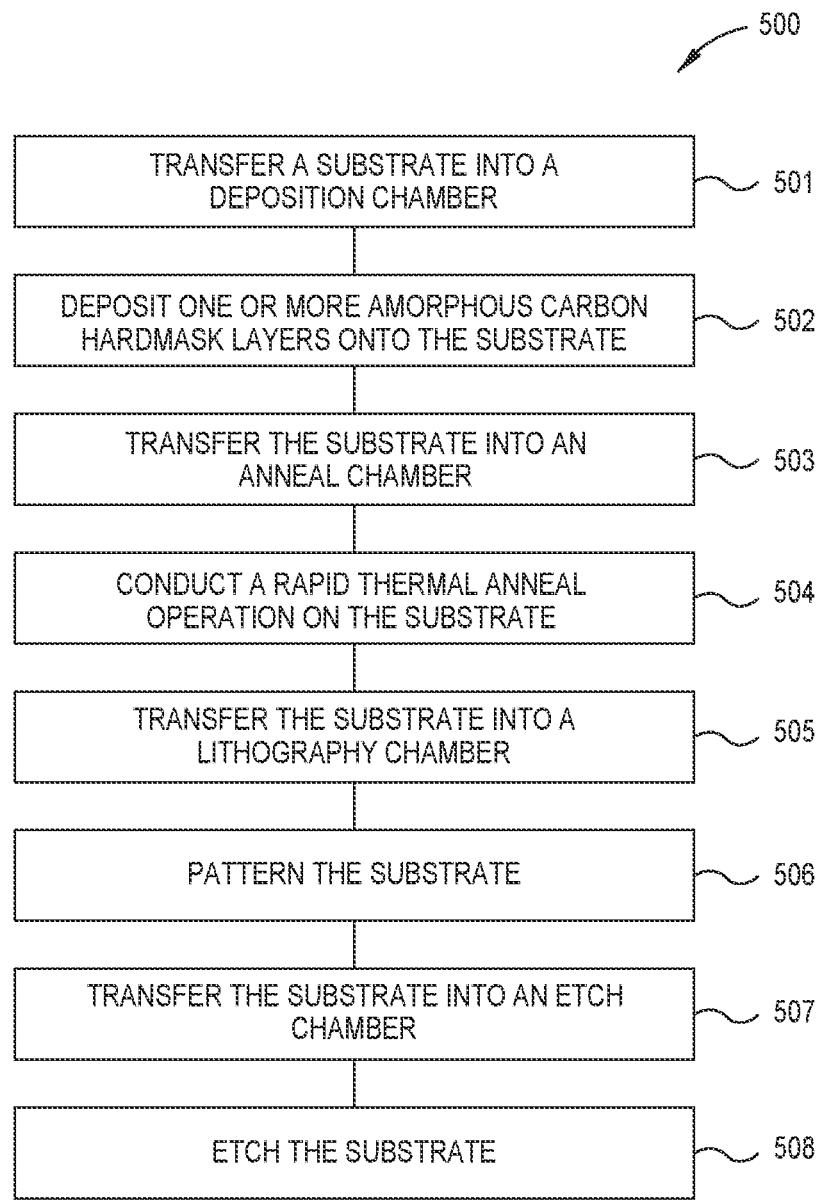
FIG. 5 is a schematic view of a method of processing substrates, according to one implementation.

FIG. 5 is a schematic view of a method 500 of processing substrates, according to one implementation. Operation 501 of the method 500 includes transferring a substrate (such as the substrate 236) into a deposition chamber, which may be the substrate processing chamber 200 used as the deposition chamber 101 as described above with respect to FIG. 1 and FIG. 2.

Operation 502 of the method includes depositing one or more amorphous carbon hardmask layers onto the substrate in the deposition chamber. The one or more amorphous carbon hardmask layers are deposited onto a plurality of base layers that are formed on a frontside surface of the substrate. In one embodiment, which can be combined with other embodiments, the plurality of base layers include a plurality of oxide layers and a plurality of nitrogen (such as nitride) layers disposed in an alternating arrangement. In one embodiment, which can be combined with other embodiments, the plurality of base layers include a plurality of oxide layers and a plurality of silicon (such as polysilicon) layers disposed in an alternating arrangement. The one or more amorphous carbon hardmask layers and the plurality of base layers are used to form a plurality of film stacks on the frontside surface of the substrate. The deposited one or more amorphous carbon hardmask layers have an $sp^2$ matrix or an $sp^3$ matrix. Aspects, such as the $sp^2$ matrix, facilitate decreased costs and increased modularity of device function as compared to operations that require an $sp^3$ matrix.

The one or more amorphous carbon hardmask layers are deposited during a deposition operation at operation 502. The one or more amorphous carbon hardmask layers are deposited onto the plurality of base layers of the substrate at a deposition temperature that is within a range of 300 degrees Celsius to 750 degrees Celsius. In one embodiment, which can be combined with other embodiments, the deposition temperature is within a range of 600 degrees Celsius to 700 degrees Celsius.

The one or more amorphous carbon hardmask layers are deposited onto the plurality of base layers of the substrate at a deposition pressure that is 12 Torr or less, such as within a range of 0.5 Torr to 12 Torr. The one or more amorphous carbon hardmask layers are deposited to a hardmask thickness that is 7 microns or less, such as within a range of 0.1 microns to 7 microns. The present disclosure contemplates that other hardmask thickness values may be used. The present disclosure contemplates that the one or more amorphous carbon hardmask layers of the substrate may be used to form a memory device or a logic device. The one or more amorphous carbon hardmask layers deposited on the plurality of base layers includes a hardmask composition. The hardmask composition includes carbon and can include one or more dopants such as boron, tungsten, and/or nitrogen.

The depositing the one or more amorphous carbon hardmask layers occurs in the deposition chamber after transferring the substrate into the deposition chamber. The depositing the one or more amorphous carbon hardmask layers includes flowing one or more reactive precursor gases into the deposition chamber and generating a plasma in the deposition chamber to deposit reactants on the plurality of base films to form the one or more amorphous carbon hardmask layers. The one or more reactive precursor gases include one or more of carbon, hydrogen, and/or nitrogen, such as $N_2$, $H_2$, $C_2H_2$ and/or $C_3H_6$. The generating the plasma include flowing one or more inert gases into the deposition chamber while applying electrical power (such as radiofrequency power) to generate the plasma. The one or more inert gases include one or more of helium and/or argon. The plasma is an inert stabilizing plasma. The one or more reactive precursor gases flow at a first flow rate that is within a range of 100 standard cubic centimeters per minute (SCCM) to 2,000 SCCM. The one or more inert gases flow at a second flow rate that is within a range of 0 SCCM to 11,900 SCCM. A total flow rate adds together the first flow rate and the second flow rate. The total flow rate is within a range of 1,000 SCCM to 12,000 SCCM.

The substrate is transferred out of the deposition chamber and into an anneal chamber (such as the anneal chamber 300 used as the anneal chamber 102) at operation 503. The substrate is transferred into the anneal chamber at an ambient temperature, such as a room temperature.

Operation 504 of the method 500 includes conducting a rapid thermal anneal operation on the substrate. The rapid thermal anneal operation is conducted in the anneal chamber. The rapid thermal anneal operation lasts for an anneal time. The anneal time is 60 seconds or less, such as within a range of 2 seconds to 30 seconds. In one embodiment, which can be combined with other embodiments, the anneal time is within a range of 8 seconds to 12 seconds, such as 10 seconds.

The rapid thermal anneal operation includes heating the substrate to an anneal temperature that is within a range of 600 degrees Celsius to 1,000 degrees Celsius, and maintaining the anneal temperature of the remainder of the anneal time. In one embodiment, which can be combined with other embodiments, the anneal temperature is within a range of 880 degrees Celsius to 920 degrees Celsius, such as 900 degrees Celsius. The anneal temperature may be measured on a backside surface of the substrate, a frontside surface of the substrate, a surface of the one or more amorphous carbon hardmask layers, and/or a surface of the plurality of base layers. The substrate is heated using one or more of a plurality of heat lamps, one or more anneal lasers, and/or one or more resistive heater elements embedded in the pedestal on which the substrate is supported. The substrate can be heated from above the substrate and/or from below the substrate.

The rapid thermal anneal operation includes flowing an anneal gas composition into the anneal chamber and exposing the substrate to the anneal gas composition while heating the substrate. The anneal gas composition includes one or more inert gases. The anneal gas composition includes one or more of argon, nitrogen, helium, and/or hydrogen. The anneal gas composition flows at an anneal flow rate that is within a range of 14,000 SCCM to 16,000 SCCM, such as about 15,000 SCCM. The rapid thermal anneal operation is conducted at an anneal pressure. In one embodiment, which can be combined with other embodiments, the anneal pressure is an ambient pressure, such as a room pressure (for example, about 760 Torr). In one embodiment, which can be combined with other embodiments, the anneal pressure is within a range of 250 mTorr to 760 Torr.

After the rapid thermal anneal operation, the one or more amorphous carbon hardmask layers of the substrate have a film stress that was altered by the rapid thermal anneal operation. In one embodiment, which can be combined with other embodiments, (such as when the substrate entering the anneal chamber has a film stress that is above 100 MPa) the rapid thermal anneal operation reduces the film stress of the one or more amorphous carbon hardmask layers to be 100 MPa or less. In one embodiment, which can be combined with other embodiments, (such as when the substrate entering the anneal chamber has a film stress that is compressive) the rapid thermal anneal operation alters the film stress of the one or more amorphous carbon hardmask layers to be tensile. The rapid thermal anneal operation reduces a bow of the substrate.

After the rapid thermal anneal operation, the one or more amorphous carbon hardmask layers of the substrate have a hydrogen content that is 14% or less, such as within a range of 5% to 12%, or within a range of 5% to 10%. The hydrogen content can be determined, for example, by using hydrogen forward scattering spectrometry (HFS). After the rapid thermal anneal operation, the one or more amorphous carbon hardmask layers of the substrate have a Young's Modulus of 40 GPa or greater, such as within a range of 45 GPa to 60 GPa. After the rapid thermal anneal operation, the one or more amorphous carbon hardmask layers of the substrate have a film density that is 1.75 $g/cm^3$ or greater, such as within a range of 1.81 $g/cm^3$ to 1.90 $g/cm^3$. The film density facilitates less film loss during the rapid thermal anneal operation as compared to other anneal operations. After the rapid thermal anneal operation, the one or more amorphous carbon hardmask layers of the substrate have an etch selectivity relative to the plurality of base layers during a cryogenic etching operation (such as the etching described in relation to operation 508). The etch selectivity is 1.0 or greater, such as within a range of 1.01 to 1.10. The etch selectivity facilitates a high etch selectivity for cryogenic etching operations.

The substrate is transferred out of the anneal chamber and into a lithography chamber (such as the lithography chamber 123) at operation 505.

Operation 506 of the method 500 includes patterning the substrate. The patterning can include conducting a lithography operation, such as a photolithography operation, on the substrate. The patterning the substrate is conducted in the lithography chamber. In one embodiment, which can be combined with other embodiments, one or more light emitters (such as those of spatial light modulators) project light onto the substrate to pattern the substrate.

The substrate is transferred out of the lithography chamber and into an etch chamber (such as the etch chamber 400 used as the etch chamber 124) at operation 507.

Operation 508 of the method 500 includes etching the substrate. The etching is conducted in the etch chamber. The etching the substrate includes conducting an etching operation on the substrate at an etch temperature. The etch temperature is a cryogenic etch temperature that is 0 degrees Celsius or less. In one embodiment, which can be combined with other embodiments, the cryogenic etch temperature is −20 degrees Celsius or less, or −50 degrees Celsius or less. In one embodiment, which can be combined with other embodiments, the cryogenic etch temperature is within a range of −120 degrees Celsius to 0 degrees Celsius. The etching includes exposing the substrate to an etch gas such as tetraethyl orthosilicate (TEOS).

The rapid thermal anneal operation of operation 504 is conducted after the depositing the one or more amorphous carbon hardmask layers of operation 502 and prior to the patterning the substrate of operation 506. The rapid thermal anneal operation of operation 504 is conducted prior to the etching the substrate of operation 508. In one embodiment, which can be combined with other embodiments, the patterning the substrate of operation 506 is conducted prior to the etching the substrate of operation 508.

One or more of the operations 501-508 can be repeated. In one embodiment, which can be combined with other embodiments, operation 502 is conducted to deposit a first hardmask thickness that is 1.5 microns and operation 504 is conducted to anneal the first hardmask thickness. Operation 502 is repeated to deposit a second hardmask thickness that is 1.5 microns and operation 504 is conducted to anneal the second hardmask thickness. Repeating operations 502, 504 facilitate forming a total hardmask thickness of 3 microns and having a neutral film stress, such as a tensile film stress and/or a film stress of 100 MPa or less.

Benefits of the present disclosure include altering a compressive stress (such as by reducing the compressive stress or altering the compressive stress to be a tensile stress) of amorphous carbon hardmask layers; enhanced etch selectivity of amorphous carbon hardmask layers, such as for use with a cryogenic etching operation; reduced hydrogen content; reduced anneal times; reduced loss of amorphous carbon hardmask layers; and enhanced properties, for example mechanical properties such as Young's Modulus. Benefits of the present disclosure also include reduced bow of substrates; reduced need for deposition on backside surfaces of substrates; reduced need for high deposition temperatures; reduced need for use of $sp^3$ carbon; reduced operational times; enhanced device performance; reduced expenditure of resources; increased throughput; and reduced loss of hardmask layers. It is contemplated that one or more aspects disclosed herein may be combined. As an example, one or more aspects, features, components, and/or properties of the system 100, the substrate processing chamber 200 (deposition chamber), the anneal chamber 300, the etch chamber 400, and/or the method 500 may be combined. Moreover, it is contemplated that one or more aspects disclosed herein may include some or all of the aforementioned benefits.

Aspects described herein achieve the aforementioned benefits over other operations that involve increasing the deposition temperature (which can decrease modularity of use of deposition chambers), operations that require use of $sp^3$ carbon hardmasks, and operations that involve backside deposition on substrates to account for substrate bow.

Operational parameters described herein facilitate neutral film stress, high Young's Modulus, and high etch selectivity for cryogenic etching of amorphous carbon hardmask layers while facilitating high film density (to facilitate reduced film loss). Such operational parameters include, for example, the anneal time, the anneal temperature, the anneal pressure, the anneal gas composition, and the anneal flow rate. The operational parameters disclosed herein facilitate unexpected results because other operations can result in either substantially low etch selectivity, substantial film loss, or film stress that is compressive and/or over 100 MPa. For example, a person may find the film density (and the film loss) unexpected when using the anneal temperature and the anneal time disclosed herein. As another example, a person may find it unexpected that mechanical properties such as the Young's Modulus are achieved using the operational parameters disclosed herein. It is believed that the unexpected results are facilitated, for example, by the anneal temperature used, the anneal time used, and the hydrogen content following the rapid thermal anneal operation.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of processing a substrate, comprising:
    depositing one or more amorphous carbon hardmask layers onto the substrate;
    conducting a rapid thermal anneal operation on the substrate after depositing the one or more amorphous carbon hardmask layers, the rapid thermal anneal operation lasting for an anneal time that is within a range of 8 seconds to 12 seconds at an anneal pressure that is within a range of 250 mTorr to 760 Torr, and the rapid thermal anneal operation comprising:
        heating the substrate to an anneal temperature that is within a range of 880 degrees Celsius to 920 degrees Celsius; and
    etching the substrate after conducting the rapid thermal anneal operation.

2. The method of claim 1, wherein the etching the substrate comprises conducting an etching operation on the substrate at an etch temperature that is 0 degrees Celsius or less.

3. The method of claim 1, wherein the one or more amorphous carbon hardmask layers have an $sp^2$ matrix or an $sp^3$ matrix.

4. The method of claim 1, wherein the rapid thermal anneal operation further comprises exposing the substrate to an anneal gas composition, the anneal gas composition comprising one or more of argon, nitrogen, helium, or hydrogen.

5. The method of claim 4, wherein the one or more amorphous carbon hardmask layers are deposited onto the substrate at a deposition temperature that is within a range of 300 degrees Celsius to 750 degrees Celsius and at a deposition pressure that is 12 Torr or less.

6. The method of claim 5, further comprising patterning the substrate after the rapid thermal anneal operation is conducted.

7. The method of claim 1, wherein the one or more amorphous carbon hardmask layers comprise a hardmask thickness that is 7 microns or less.

8. The method of claim 1, wherein the rapid thermal anneal operation alters a film stress of the one or more amorphous carbon hardmask layers to be 100 MPa or less.

9. The method of claim 1, wherein the rapid thermal anneal operation alters a film stress of the one or more amorphous carbon hardmask layers to be tensile.

10. A non-transitory computer readable medium for processing a substrate comprising instructions that, when executed, cause a plurality of operations to be conducted, the plurality of operations comprising:
    depositing one or more amorphous carbon hardmask layers onto the substrate;
    conducting a rapid thermal anneal operation on the substrate after depositing the one or more amorphous carbon hardmask layers, the rapid thermal anneal operation lasting for an anneal time that is within a range of 8 seconds to 12 seconds, and the rapid thermal anneal operation comprising:
        heating the substrate to an anneal temperature that is within a range of 880 degrees Celsius to 920 degrees Celsius; and
    etching the substrate after conducting the rapid thermal anneal operation.

11. The non-transitory computer readable medium of claim 10, wherein the etching the substrate comprises conducting an etching operation on the substrate at an etch temperature that is 0 degrees Celsius or less.

12. The non-transitory computer readable medium of claim 10, wherein the one or more amorphous carbon hardmask layers have an $sp^2$ matrix or an $sp^3$ matrix.

13. The non-transitory computer readable medium of claim 10, wherein the rapid thermal anneal operation further comprises exposing the substrate to an anneal gas composition, the anneal gas composition comprising one or more of argon, nitrogen, helium, or hydrogen.

14. The non-transitory computer readable medium of claim 13, wherein the one or more amorphous carbon hardmask layers are deposited onto the substrate at a deposition temperature that is within a range of 300 degrees Celsius to 750 degrees Celsius and at a deposition pressure that is 12 Torr or less.

15. The non-transitory computer readable medium of claim 14, wherein the plurality of operations further comprise patterning the substrate after the rapid thermal anneal operation.

16. The non-transitory computer readable medium of claim 10, wherein the rapid thermal anneal operation alters a film stress of the one or more amorphous carbon hardmask layers to be 100 MPa or less.

17. A system for processing a substrate, comprising:
a deposition chamber;
an anneal chamber;
a transfer chamber coupled to the deposition chamber and the anneal chamber;
a cryogenic etch chamber;
a controller comprising instructions that, when executed, cause:
the deposition chamber to deposit one or more amorphous carbon hardmask layers onto the substrate,
the anneal chamber to conduct a rapid thermal anneal operation on the substrate after the depositing the one or more amorphous carbon hardmask layers onto the substrate, the rapid thermal anneal operation lasting for an anneal time that is within a range of 8 seconds to 12 seconds, and the rapid thermal anneal operation comprising:
heating the substrate to an anneal temperature that is within a range of 880 degrees Celsius to 920 degrees Celsius; and
the cryogenic etch chamber to etch the substrate after the rapid thermal anneal operation is conducted.

18. The system of claim 17, wherein the deposition chamber, the anneal chamber, and the transfer chamber are mounted to a frame of a cluster tool.

* * * * *